United States Patent
Iida

(10) Patent No.: US 6,701,613 B2
(45) Date of Patent: Mar. 9, 2004

(54) MULTILAYER CIRCUIT BOARD AND METHOD OF MANUFACTURING THE SAME

(75) Inventor: Kenji Iida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 408 days.

(21) Appl. No.: 09/789,771

(22) Filed: Feb. 22, 2001

(65) Prior Publication Data

US 2002/0023895 A1 Feb. 28, 2002

(30) Foreign Application Priority Data

Aug. 31, 2000 (JP) ........................................ 2000-263869

(51) Int. Cl.[7] .................... H05K 3/02; H01B 13/00; C25D 5/36

(52) U.S. Cl. ..................... 29/847; 29/846; 29/831; 29/852; 216/18; 216/41; 216/52; 216/13; 205/118; 205/222; 205/220

(58) Field of Search .......................... 29/846, 847, 831, 29/830, 852, 825; 216/13, 17, 18, 41, 49, 52; 205/125, 118, 222, 220; 427/96–99; 451/41; 174/250

(56) References Cited

U.S. PATENT DOCUMENTS

| | | | | |
|---|---|---|---|---|
| 4,657,778 A | * | 4/1987 | Moran | 427/555 |
| 4,915,759 A | * | 4/1990 | Moran | 156/89.15 |
| 5,302,551 A | * | 4/1994 | Iranmanesh et al. | 438/633 |
| 5,895,581 A | * | 4/1999 | Grunwald | 216/13 |
| 5,916,453 A | | 6/1999 | Beilin et al. | 216/38 |

* cited by examiner

*Primary Examiner*—A. Dexter Tugbang
*Assistant Examiner*—Tai Nguyen
(74) *Attorney, Agent, or Firm*—Armstrong, Kratz, Quintos, Hanson & Brooks, LLP

(57) ABSTRACT

In a method of manufacturing a multilayer circuit board, cable patterns in a plurality of cable layers can be precisely formed, and the cable layer are formed with higher density, with higher reliability. The multilayer circuit board comprises: a plurality of cable layers, each of which includes electric conductive sections; a plurality of first insulating layers, each of which encloses the electric conductive sections in each cable layer and fills spaces between the electric conductive sections; and post vias electrically connecting the electric conductive sections in one cable layer to those in another cable layer. Height of the electric conductive sections in each cable layer are equal to that of the first insulating layer enclosing those electric conductive sections.

8 Claims, 9 Drawing Sheets

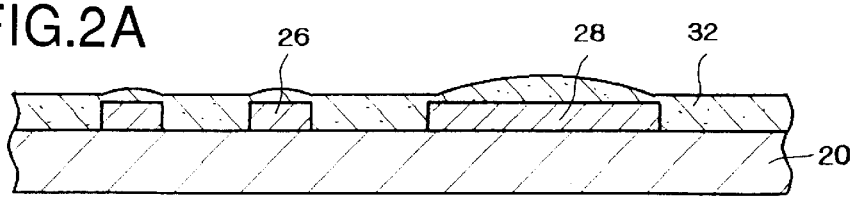
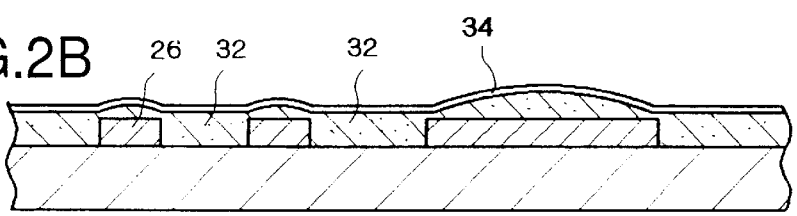
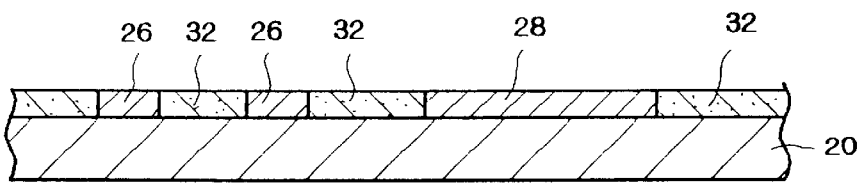
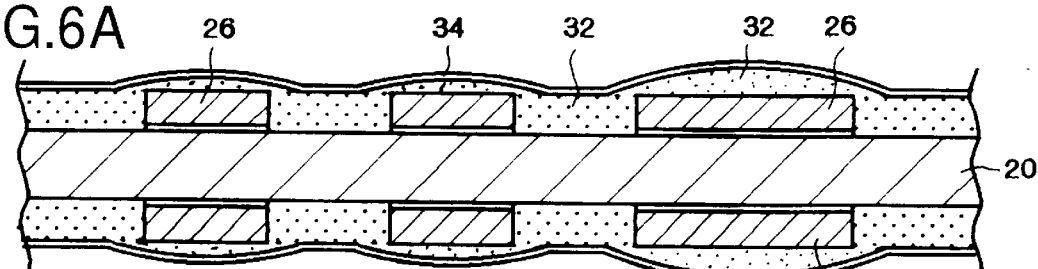
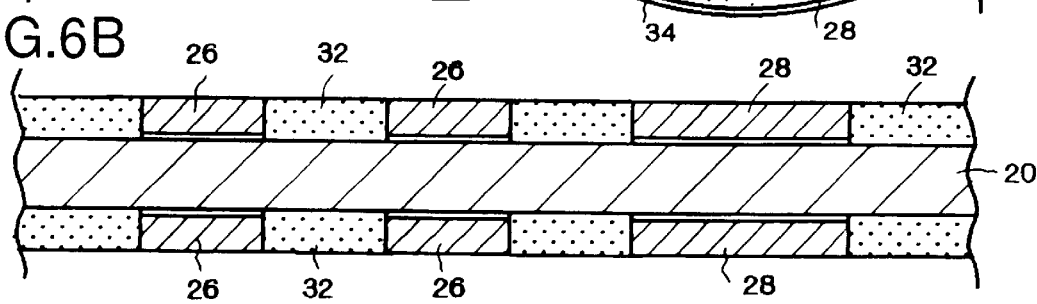

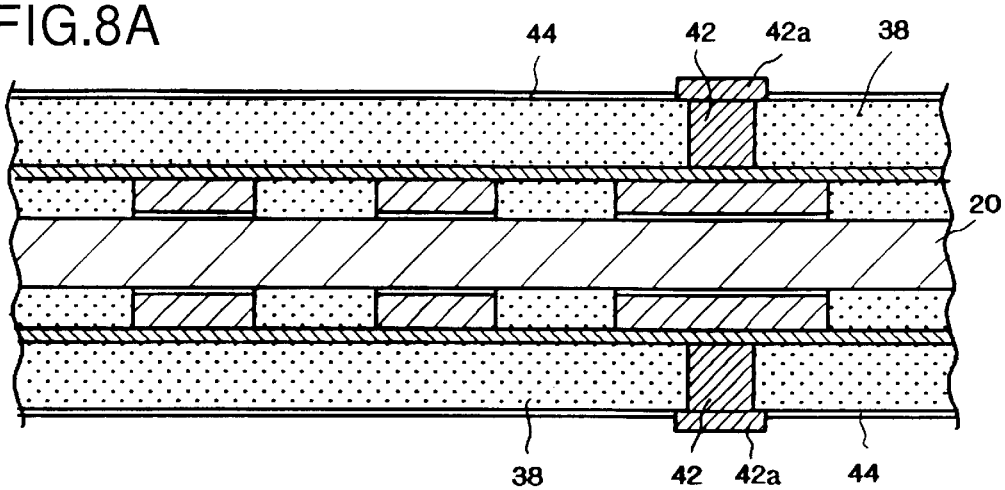
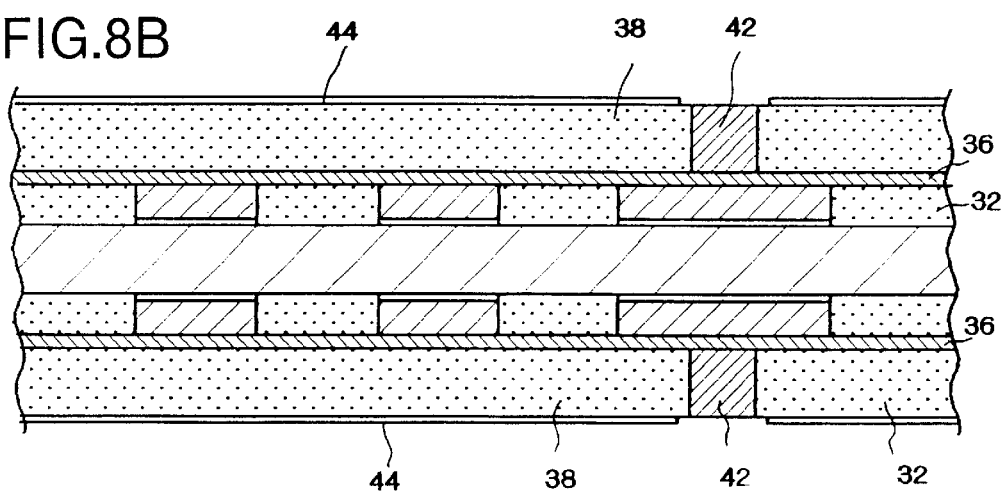
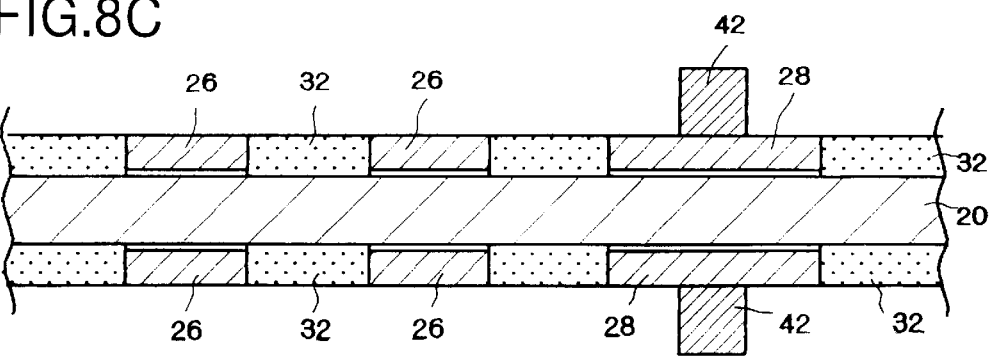

MULTILAYER CIRCUIT BOARD AND METHOD OF MANUFACTURING THE SAME

BACKGROUND OF THE INVENTION

The present invention relates to a multilayer circuit board and a method of manufacturing the multilayer circuit board, more precisely relates to a multilayer circuit board, in which cable patterns can be highly precisely formed and high density wiring can be realized, and a method of manufacturing this multilayer circuit board.

In a multilayer circuit board, e.g., a printed circuit board, a plurality of cable layers are piled, on an organic core board with insulating layers, which electrically insulates the piled cable layers. Cable patterns in the different cable layers are electrically connected by vias. A conventional multilayer circuit board is shown in FIG. 11. In FIG. 11, cable patterns 14 are piled on a surface of a core board 10 with insulating layers 12. The cable patterns 14 in different cable layers are mutually connected by vias 16. Each via 16 is formed by the steps of: boring a via hole in the insulating layer 12; and plating an inner face of the via hole and a surface of the insulating layer 12. By the vias 16, the cable patterns 14 in the different layers can be electrically connected with each other. The cable patterns 14 in each layer are formed by the steps of: forming an electric conductive layer on a surface of the insulating layer 12 by plating; and etching the electric conductive layer. Namely, the multilayer circuit board, which includes the piled cable patterns 14, is manufactured by forming the vias 16 and the cable patterns 14 in each insulating layer 12.

To precisely form the cable patterns with higher density, the core board is made of a ceramic and the cable layers (the cable patterns) are made thinner. The ceramic multilayer circuit board has good quality but manufacturing cost must be higher. Therefore, a multilayer circuit board, whose core board is an organic board and which has functions equal to the ceramic multilayer circuit board, is required.

Unlike the ceramic board, flatness of the organic board is lower, and the organic board is easily deformed, so the multilayer circuit board including the organic core board has following disadvantages.

In the case of forming the via holes in the insulating layer by laser means or photolithography, it is difficult to precisely form the small-sized via holes if thickness of the inslulating layer is uneven and the surface of the core board is not flat. By the uneven thickness of the insulating layer and the waved surface of the core board, focusing accuracy of the patterns are made lower and the vias having prescribed size cannot be formed by laser means or photolithography. Further, diameters of an opening section and a bottom section of the vias are changed if the thickness of the insulating layer is uneven.

If the thickness of the insulating layer is uneven, aspect ratio of the via holes in the insulating layer are not fixed. In the case of plating the inner face of the via hole, plating property is highly influenced by the aspect ratio of the via hole. Therefore, reliability of the vias, which electrically connect the cable patterns in the different layers, must be lower.

As shown in FIG. 11, in the conventional multilayer circuit board, the vias 16 in the adjacent layers are electrically connected by land pads 18 and arranged like a zigzag form. By arranging the vias 16 in the zigzag form, extra spaces for arranging the vias 16 are required, so that spaces for arranging the cable patterns 14 must be narrower. With the narrow arranging spaces, the cable patterns 14 cannot be formed with higher density.

The surface of the insulating layer 12, in which the cable patterns 14 are formed, is laminated with a plastic film or coated with a resin after the cable patterns 14 are formed. By covering the cable patterns 14 with the insulating layer 12, the surface of the insulating layer 12 is waved, so that the flatness of the surface of the insulating layer 12 must be badly influenced. In the case of forming the cable patterns 14 by etching the electric conductive layer on the insulating layer 12, the waved surface of the insulating layer 12 makes accuracy of the cable patterns 14 lower because patterning accuracy of the photolithography, in which a photosensitive resist layer on the surface of the electric conductive layer is patterned, is badly influenced.

The cable patterns 14 and the vias 16 are constituted by electric conductive materials plated. In the case of plating a large-sized circuit board, it is difficult to make thickness of the plated layer (the electric conductive layer) even, so that thickness of the plated layer is different at portions in the board. By the uneven thickness of the electric conductive layer or the cable patterns 14, the flatness of the surface of the insulating layer 20 is made lower. Therefore, it is difficult to precisely form the cable patterns with higher accuracy.

Unlike the multiylayer circuit board shown in FIG. 11, some multiylayer circuit boards have post vias, which are capable of electrically connecting cable patterns in different layers, instead of the vias, which are formed by filling the via holes with plated metal. The multiylayer circuit board having the post vias is manufactured by the steps of: forming cable patterns and land pads; setting post vias at the land pads; covering the cable patterns, the land pads and the post vias with an insulating layer; and abrading a waved surface of the insulating layer, which is waved by the cable patterns, the post vias, etc., so as to expose upper end faces of the post vias and make the surface of the insulating layer flat (see U.S. Pat. No. 5,916,453). In this method, it is difficult to make the surface of the insulating layer highly flat and it is also difficult to form highly minute cable patterns if thickness of the cable patterns and height of the post vias are not fixed.

SUMMARY OF THE INVENTION

An object of the present invention is to provide a multilayer circuit board, in which the cable patterns in a plurality of cable layers can be precisely formed and the cable layer are formed with higher density, with higher reliability.

Another object of the present invention is to provide a method of manufacturing the multilayer circuit board.

To achieve the object, the multilayer circuit board of the present invention comprises: a plurality of cable layers, each of which includes electric conductive sections; a plurality of first insulating layers, each of which encloses the electric conductive sections in each cable layer and fills spaces between said electric conductive sections; and post vias electrically connecting the electric conductive sections in one cable layer to those in another cable layer, wherein height of the electric conductive sections in each cable layer are equal to that of the first insulating layer enclosing those electric conductive sections.

The multilayer circuit board may further comprise a second insulating layer, which is formed to enclose the post vias, wherein height of the post vias are equal to that of the second insulating layer.

The method of manufacturing a multilayer circuit board of the present invention comprises the steps of: forming a plurality of cable layers, each of which includes electric conductive sections; forming a plurality of first insulating layers, each of which encloses the electric conductive sections in each cable layer; and forming post vias, which electrically connect the electric conductive sections in one cable layer to those in another cable layer, wherein the electric conductive sections of each cable layer are formed by the steps of: forming a first electric conductive layer; forming a first resist layer, whose thickness is equal to that of the electric conductive sections to be formed, on a surface of the first electric conductive layer; etching the first resist layer so as to expose parts of the first electric conductive layer corresponding to the electric conductive sections to be formed; and executing electrolytic plating on the exposed parts of the first electric conductive layer so as to cast up the exposed parts and form said electric conductive sections until height of said electric conductive sections are made higher than that of the first resist layer; forming a first stopper metal layer on the first resist layer and the electric conductive sections, which have been cast up by electrolytic plating; and abrading the electric conductive sections until the height of the electric conductive sections are made equal to that of the first resist layer.

In the method, the electric conductive sections of each cable layer may be further treated by the steps of: removing the first stopper metal layer and the first resist layer; removing the exposed parts of the first electric conductive layer; and forming the first insulating layer so as to enclose the electric conductive sections and fill spaces there between.

In the method, the electric conductive sections of each cable layer may be further treated by the steps of: removing the first stopper metal layer and the first resist layer; removing the exposed parts of the first electric conductive layer; forming the first insulating layer so as to cover the electric conductive sections and fill spaces there between; forming a second stopper metal layer on the first insulating layer; and abrading the first insulating layer on the electric conductive sections until the height of the electric conductive sections are made equal to that of the first insulating layer.

In the method, the post vias may be formed by the steps of: forming a second electric conductive layer on the electric conductive sections and the first insulating layer; forming a second resist layer on the second electric conductive layer; forming via holes in the second resist layer; and executing electrolytic plating in the via holes so as to form the post vias.

The method may further comprise the steps of: forming a third stopper metal layer on the second resist layer and the post vias; and abrading the post vias until the height of the post vias are made equal to that of the second resist layer.

The method may further comprise the steps of: removing the second resist layer; forming a second insulating layer, which covers and encloses the post vias; forming a fourth stopper metal layer on the second insulating layer; and abrading parts of the second insulating layer corresponding to the post vias until the height of the post vias are made equal to that of the second insulating layer.

In the method, the cable layers, the insulating layers and the post vias may be formed on both side of a core board.

In the method, the resist layer may be treated to improve hardness thereof. With this method, abrading step can be executed easily.

In the multilayer circuit board of the present invention, the height of the electric conductive sections, e.g., the cable patterns, the land pads, in each cable layer are equal to that of the first insulating layer enclosing those electric conductive sections. With this structure, flatness of the cable layer can be improved, so that flatness of the piled cable layers and insulating layers can be improved. Therefore, forming accuracy of the cable patterns, the post vias, etc. can be highly improved, and the multilayer circuit board can be effective for high density wiring.

In the method of the present invention, the height of the electric conductive section can be even with higher accuracy. And the height of the electric conductive sections can be correctly equal to that of the first insulating layer, so that the high quality multilayer circuit board, in which the cable pattern can be formed with higher accuracy, can be manufactured.

BRIEF DESCRIPTION OF THE DRAWINGS

Embodiments of the present invention will now be described by way of examples and with reference to the accompanying drawings, in which:

FIGS. 2A–2C are explanation views showing the steps of forming an insulating layer enclosing the cable patterns and the land pad;

FIGS. 6A and 6B are explanation views showing the steps of forming the insulating layers, which enclose the cable patterns and the land pads, on the both sides of the core board;

FIGS. 8A–8C are explanation views showing the steps of forming the post vias on the land pads of the both sides of the core board;

DETAILED DESCRIPTION OF THE PREFERRED EMBODIMENTS

Preferred embodiments of the present invention will now be described in detail with reference to the accompanying drawings.

First Embodiment

A first embodiment will be explained with reference to FIGS. 1A–4D. FIGS. 1A–4D show the steps of manufacturing the multilayer circuit board of the present embodiment.

FIGS. 1A–1F shows the steps of forming a first cable layer (cable patterns) and a land pad, to which a post via will be connected, on an organic core board 20.

Figure 1A:
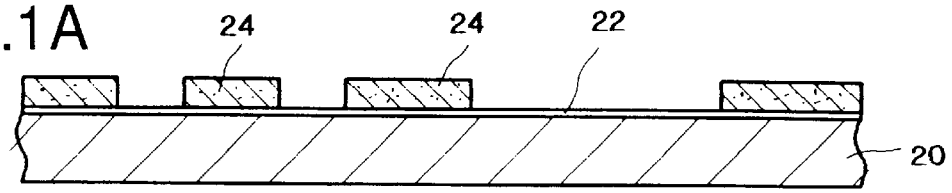
FIGS. 1A–1F are explanation views of a first embodiment of the present invention, in which the steps of forming cable patterns and a land pad on a core board are shown.

In FIG. 1A, an electric conductive layer 22 is formed on a surface of the core board 20 by nonelectrolytic copper plating, and a resist sections 24, which are formed into predetermined shapes, are formed on a surface of the electric conductive layer 22. The electric conductive layer 22 acts as an electric feeder layer for electrolytic plating. The resist sections 24 are formed by the steps of: forming a photosensitive resist layer on the surface of the electric conductive layer 22; exposing the photosensitive resist layer with a patterning mask; and developing the masked pattern of the resist sections 24 having the predetermined patterns. By patterning the resist sections 24, the resist layer is removed except the resist sections 24, so that the electric conductive layer 22 is partially exposed.

Thickness of the resist sections 24 defines thickness of the cable patterns and the land pads. Therefore, the photosensitive resist layer has even thickness. In the present embodiment, the resist layer is formed by laminating dry film resist. The dry film resist has even thickness, so it can be effectively used. Further, the photosensitive resist layer may be formed by photosensitive resin.

The thickness of the photosensitive resist layer influences patterning accuracy of the cable patterns, which are formed by the photolithography. The thickness of the photosensitive resist layer is defined on the basis of width of the cable pattern, etc. For example, in the case of the cable pattern having the width of 25 $\mu$m, the thickness of the photosensitive resist layer may be 25 $\mu$m. Namely, the thickness of the photosensitive resist layer can be selected. In ordinary cases, the thickness of the photosensitive resist layer is 5–50 $\mu$m.

Figure 1B:
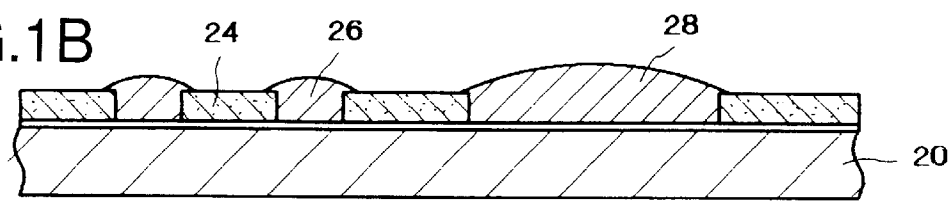

In FIG. 1B, copper layers are cast up on the exposed parts of the electric conductive layer 22 by electrolytic copper plating so as to form electric conductive sections 26 and 28. At that time, the electric conductive layer 22 acts as the electric feeder of the plating. The electric conductive sections 26 will be the cable patterns; the electric conductive sections 28 will be the land pad, on which the post via is formed. In the case of forming the electric conductive sections 26 and 28 by electrolytic copper plating, spaces between the adjacent resist sections 24 are fully filled with the plated copper, and an upper end of the plated copper is projected from an upper end of each resist section 24. In FIG. 1B, upper ends of the electric conductive sections 26 and 28 are cast up like hills or mountains.

Successively, the resist sections 24 are treated to improve their hardness. By improving the hardness, the resist sections 24 can endure abrasion in the following step. Generally, the photosensitive resist does not have enough hardness. So the resist sections 24 are further hardened by light radiation or a bake treatment.

Figure 1C:
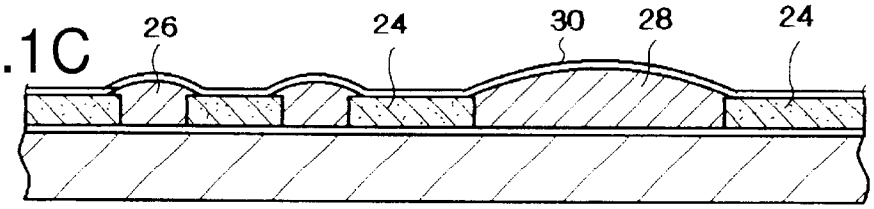

In FIG. 1C, the resist sections 24, which have been hardened, and the electric conductive sections 26 and 28 are wholly coated with a stopper metal layer 30. The stopper metal layer 30 is formed by nonelectrolytic plating, sputtering, etc. The stopper metal layer 30 is formed so as to abrade correctly the electric conductive sections 26 and 28 until their thickness reach the thickness of the resist sections 24.

Figure 1D:
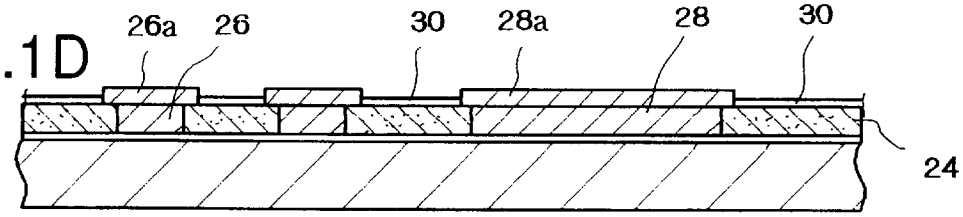

In FIG. 1D, the electric conductive sections 26 and 28 have been abraded. The upper end of the electric conductive sections 26 and 28 are made flat and in the same plane. In the present embodiment, they were abraded by mechanical buff means including a buff roll. Thin flashes 26a and 28a, which are formed by the abrasion, are left on the surfaces of the electric conductive sections 26 and 28.

Figure 1E:
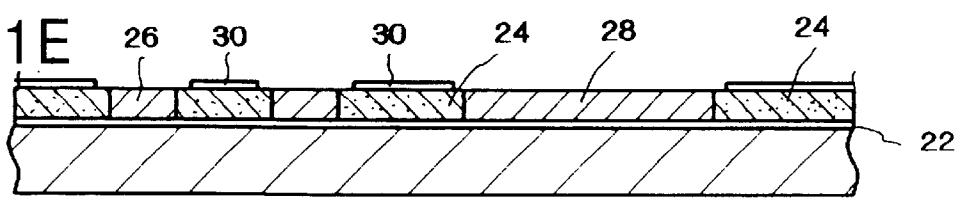

In FIG. 1E, the flashes 26a and 28a on the surfaces of the electric conductive sections 26 and 28 have been removed by soft etching.

The stopper metal layer 30 is partially left on the resist sections 24. In the abrasion step, the upper ends of the electric conductive sections 26 and 28, which were projected from the resist sections 24, were abraded and removed together with the stopper metal layer 30. When the electric conductive sections 26 and 28 are abraded until height of the electric conductive sections 26 and 28 is equal to height of the resist sections 24, the stopper metal layer 30 left on the resist sections 24 stops the abrasion. The stopper metal layer 30 on the resist sections 24 allows to abrade the electric conductive sections 26 and 28 until their height reach the height of the resist sections 24. With this function, the thickness of the electric conductive sections 26 and 28, which were thicker than that of the resist sections 24, can be equal to that of the resist sections 24, and the surfaces of the resist sections 24 and the electric conductive sections 26 and 28 can be in the same horizontal plane. Since the thickness of the electric conductive sections 26 and 28 are made equal to that of the resist sections 24 by the abrasion, the thickness of the electric conductive sections 26 and 28 can be correctly controlled even if the original thickness of the electric conductive sections 26 and 28 are uneven by unstable plating properties.

Figure 1F:
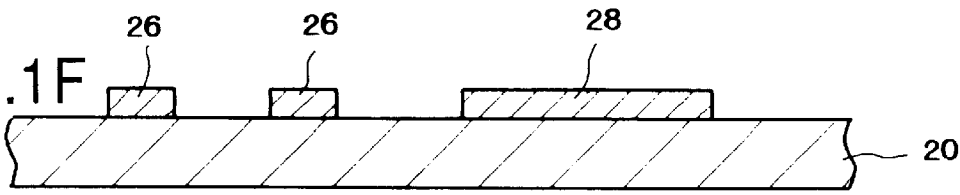

In FIG. 1F, the stopper metal layer 30 are perfectly removed. Then, the resist sections 24 are removed by etching. Further, the electric conductive layer 22, which were exposed on the core board 20, are removed by soft etching. The electric conductive sections 26, which will be the cable patterns, and the electric conductive sections 26, which will be the land pad, are left on the core board 20. Note that, in the case of removing the stopper metal layer 30 by chemical etching, the electric conductive section 28 must not contact etching liquid for removing the stopper metal layer 30. The stopper metal layer 30 is formed with considering the etching operation.

As shown in FIG. 1F, the feature of the method of the present embodiment is that the surfaces of the cable patterns and the land pads, which are formed on the surface of the core board 20, are abraded and their height are made equal to the height of the resist sections 24.

FIGS. 2A–2C shows the steps of forming an insulating layer covering the electric conductive sections 26 and 28.

In FIG. 2A, the surface of the core board 20, on which the electric conductive sections 26 and 28 are formed, is laminated with an insulating film, and spaces between the electric conductive sections 26 and 28 are filled with an insulating material. With this structure, an insulating layer 32 is formed. In the present embodiment, the surface of the core board 20 is laminated with the insulating film, then the insulating film is pressed so as to form the insulating layer 32 between the electric conductive sections 26 and 28. For example, the insulating film is polyethylene film covered with an insulating material.

In FIG. 2B, a stopper metal layer 34 is formed on a surface of the insulating layer 32 as well as the stopper metal layer 30 shown in FIG. 1C.

With the stopper metal layer 34, the height of the insulating layer 32 can be made equal to that of the electric conductive sections 26 and 28 by abrading the surface of the insulating layer 32. The insulating layer 32 not only fills the spaces between the electric conductive sections 26 and 28 but also slightly covers the surfaces of the electric conductive sections 26 and 28. By forming the stopper metal layer 32 and executing the abrasion, the height of the insulating layer 32 can be equal to that of the electric conductive sections 26 and 28.

In FIG. 2C, the stopper metal layer 32 has been removed, by etching, after the abrasion. The height of the insulating layer 32 is equal to that of the electric conductive sections 26 and 28, and their surfaces are flat and in the same plane. With the above-described steps, a first layer of the multilayer circuit board can be formed. Note that, in the following description, the electric conductive sections 26 are called the cable patterns 26; the electric conductive section 28 is called the land pad 28.

FIGS. 3A–3F show the steps of forming a post via on the land pad 28 of the first layer.

Figure 3A:
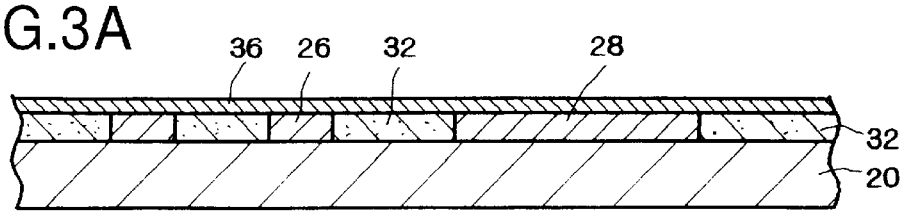
FIGS. 3A–3F are explanation views showing the steps of forming a post via on the land pad.

In FIG. 3A, an electric conductive layer 36, which will be used as an electric feeder layer for electrolytic plating, is formed, by nonelectrolytic copper plating, on the cable patterns 26, the land pad 28 and the insulating layer 32.

Figure 3B:
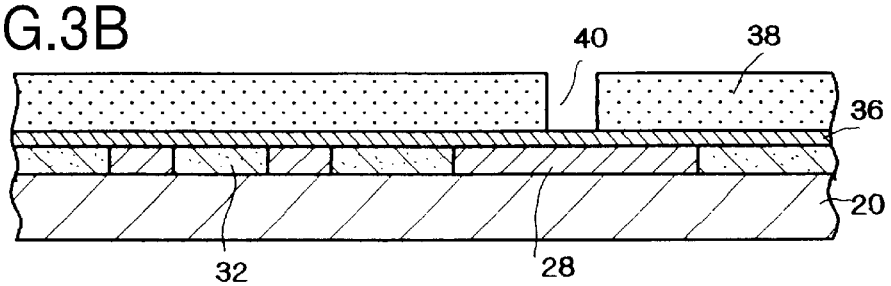

In FIG. 3B, a resist layer 38 is formed on a surface of the electric conductive layer 36, and a via hole 40 is bored in the resist layer 38. The via hole 40 is bored by laser means or photolithography until the surface of the land pad 28 is exposed as a bottom face of the via hole 40.

The resist layer 38 is formed on the flat surfaces of the cable patterns 26, the land pad 28 and the insulating layer 32 by laminating dry film resist thereon. Therefore, waving a surface of the resist layer 38 can be prevented. With this resist layer 38, optical setting, e.g., focus, for boring the via hole 40 can be precisely set, so that the very minute via hole 40 can be correctly and precisely formed.

Figure 3C:
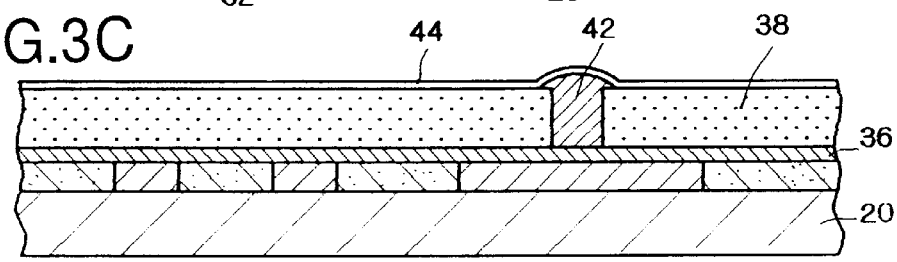

In FIG. 3C, the via hole 40 is filled with copper by electrolytic plating, in which the electric conductive layer 36 is used as the electric feeder layer, so as to form an electric conductive section 42, which will be the post via. Further, a stopper metal layer 44 is formed on surfaces of the resist layer 38 and the electric conductive section 42. The electric conductive section 42 fills the via hole 40 and whose upper end is slightly projected from the surface of the resist layer 38. The stopper metal layer 44 acts as a stopper when the projected upper end of the electric conductive section 42 is abraded so as to make the height of the electric conductive section 42 equal to that of the resist layer 38. The resist layer 38 is hardened, by baking, etc., after the via hole 40 is formed.

Figure 3D:
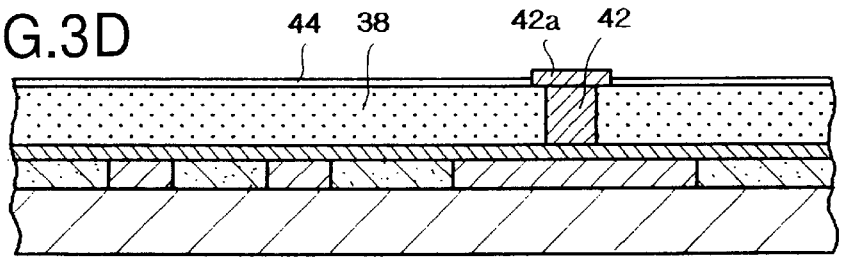

In FIG. 3D, the height of the abraded electric conductive section 42 is equal to the thickness of the resist layer 38. A flash 42a has been formed on the electric conductive section 42 during the abrasion.

Figure 3E:
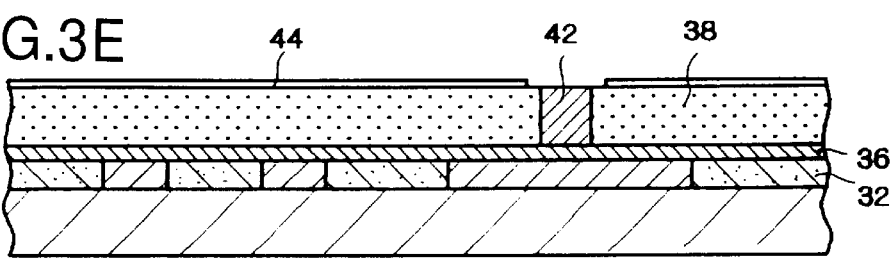

In FIG. 3E, the flash 42a has been removed by soft etching.

Further, the stopper metal layer 44 is removed by etching, the resist layer 38 is removed, then the electric conductive layer 36 is removed by soft etching, so that the electric conductive section 42 will be left on the land pad 28.

Figure 3F:
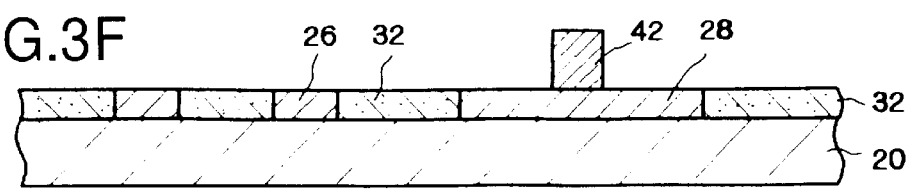

In FIG. 3F, the electric conductive section 42 is left on the land pad 28 as the post via.

FIGS. 4A–4D show the steps of forming an insulating layer in the layer in which the electric conductive section 42 is formed.

Figure 4A:
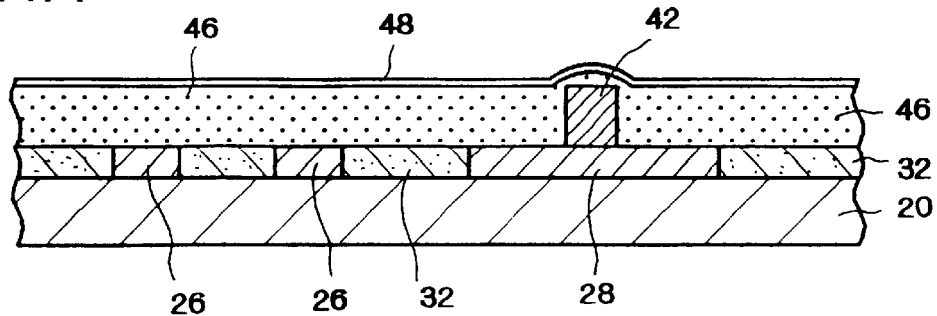
FIGS. 4A–4D are explanation views showing the steps of forming another insulating layer enclosing the post via.

In FIG. 4A, an insulating layer 46 is formed by laminating the cable patterns 26, the land pad 28, the insulating layer 32 an the electric conductive section 42 with insulating film, then the insulating layer 46 is coated with a stopper metal layer 48.

For example, the insulating film is polyethylene film, whose one face is covered with an insulating material. The one face covered with the insulating material is headed to the core board 20, then the insulating film is heated and pressed, so that the insulating film is adhered and the flat insulating layer 46 is formed.

When the insulating layer 46 is formed, an upper face of the electric conductive section 42 is covered with the insulating layer 46. Therefore, the insulating material covering over the electric conductive section 42 must be removed by abrasion, and the height of the electric conductive section 42 must be made equal to that of the insulating layer 46. So the stopper metal layer 48 acts as a stopper when the insulating material is abraded.

Figure 4B:
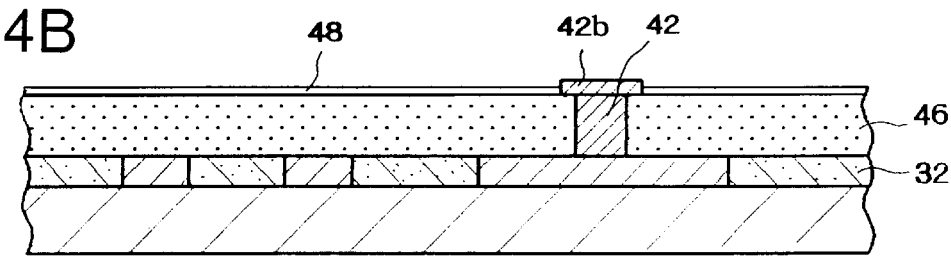

In FIG. 4B, the height of the electric conductive layer 42 is made equal to that of the insulating layer 48 by abrasion. The stopper metal layer 48 is left on a surface of the insulating layer 46. A flash 42b is left on the electric conductive section 42.

Figure 4C:
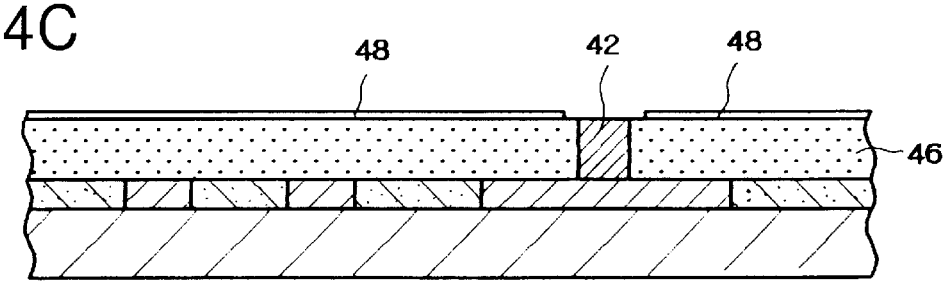

In FIG. 4C, the flash 42b has been removed from the electric conductive section 42 by soft etching.

Figure 4D:
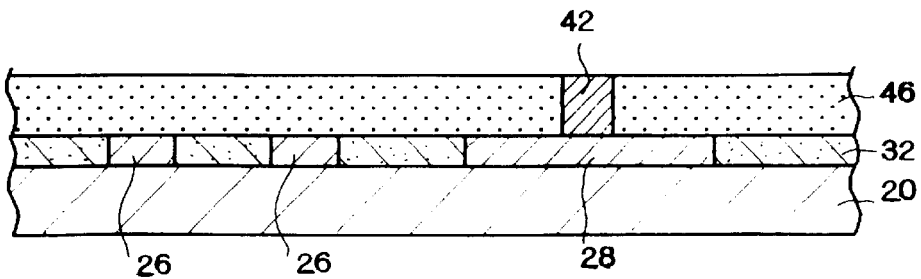

In FIG. 4D, the stopper metal 48 left on the surface of the insulating layer 46 has been removed. The post via 42 is formed.

The layer including the cable patterns 26 and the land pad 28, which are formed on the surface of the core board 20, is the first layer. The insulating layer 46 electrically insulates the first layer from a second layer, which will be formed on the insulating layer 46 and will also include the cable patterns and the post vias. The insulating layer 46 matches' impedance between the cable patterns in the first layer and the second layer. To match the impedance, the insulating material and thickness of the insulating layer 46 are properly selected.

The cable patterns and the post vias in the second layer can be formed by the steps shown in FIGS. 1A–2C. Post vias, which connects the second layer to a third layer, can be formed by the steps shown in FIGS. 3A–4D.

Second Embodiment

In the first embodiment, multilayer circuits are formed on one side of the core board 20. To effectively form circuits, a plurality of circuit layers are formed on the both sides of the core board. By forming on the both sides, shrinkage of the insulating layers, etc. can be balanced and deformation of the core board can be prevented.

A second embodiment will be explained with reference to FIGS. 5A–8C. A plurality of circuit layers are formed on the both sides of the core board 20. The circuit layers are formed as well as the first embodiment, so elements explained in the first embodiment are assigned the same symbols and explanation will be omitted.

FIGS. 5A–5E show the steps of forming the electric conductive sections of the first layer.

Figure 5A:
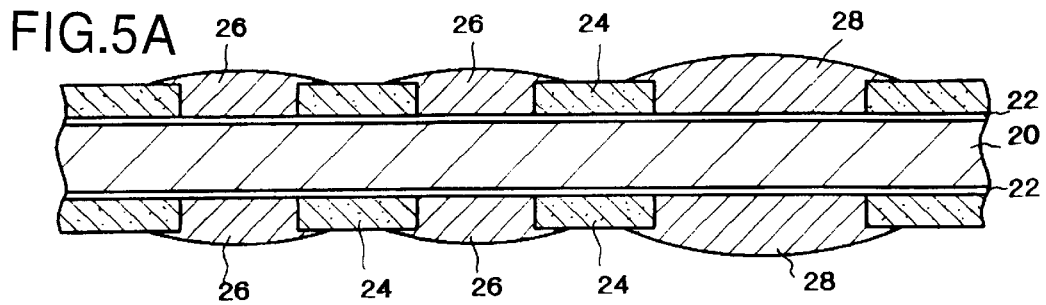
FIGS. 5A–5E are explanation views of a second embodiment of the present invention, in which the steps of forming the cable patterns and the land pads on both sides of the core board are shown.

In FIG. 5A, the electric conductive layers 22 are respectively formed on the both surfaces of the core board 20. The resist sections 24, which are formed into prescribed shapes, are formed on the surfaces of the electric conductive layers 22, then the electric conductive sections 26 and 28 are formed. In the present embodiment, the electric conductive sections 26 and 28 are symmetrically formed with respect to the core board 20, but the arrangement is not limited to the shown example. The electric conductive sections 26 and 28 are formed by plating. At that time, the electric conductive layers act as electric feeder layers, so the electric conductive sections 26 and 28 can be simultaneously formed on the both sides of the core board 20.

Figure 5B:
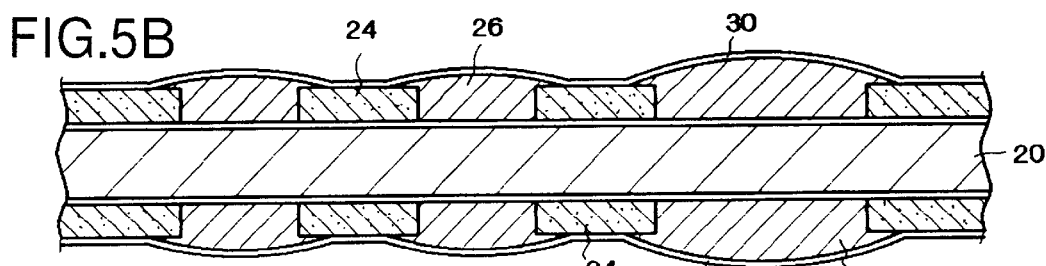

In FIG. 5B, the resist sections 24 are hardened, and the electric conductive sections 26 and 28 and the resist sections 24 on the both sides of the core board 20 are covered with the stopper metal layers 30.

Figure 5C:
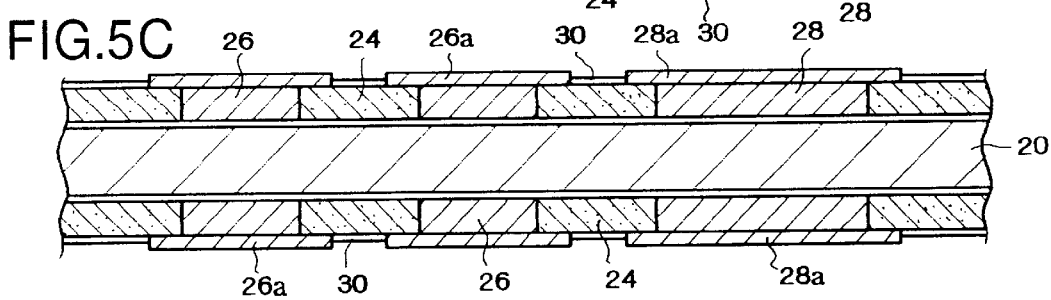

In FIG. 5C, the electric conductive sections 26 and 28 have been abraded by, for example, mechanical buff means. The height of the electric conductive sections 26 and 28 are equal to the thickness of the resist sections 24.

Figure 5D:
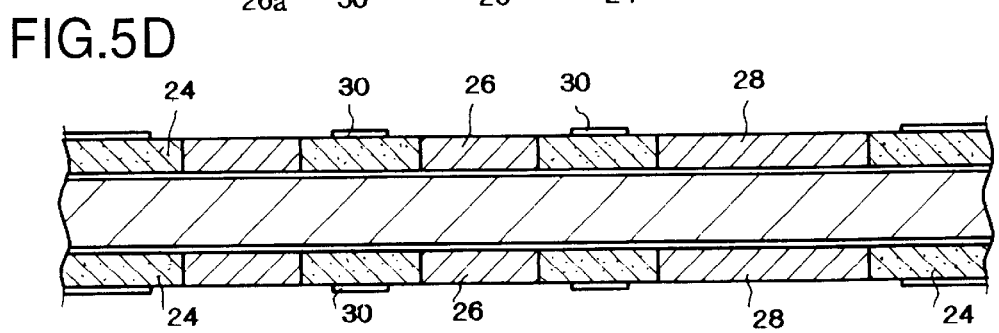

In FIG. 5D, flashes 26a and 28a of the electric conductive sections 26 and 28 have been removed by soft etching.

Figure 5E:
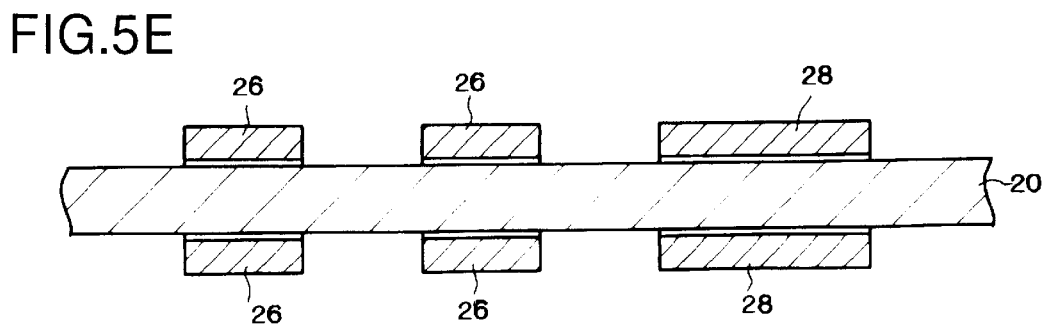

In FIG. 5E, the stopper metal layers 30 and the resist sections 24 have been removed by etching. The exposed parts of the electric conductive layers 22, which were exposed on the surfaces of the core board 20, have been removed by soft etching. Therefore, the electric conductive sections 26 and 28 are left on the both sides of the core board 20. The electric conductive sections 26 will be the cable patterns; the electric conductive sections 28 will be the land pads.

FIGS. 6A and 6B show the steps of forming the insulating layers 32, whose thickness are equal to the height of the cable patterns 26 and the land pads 28, on the both sides of the core board 20.

In FIG. 6A, the both surfaces of the core board 20 are laminated with the insulating films, and spaces between the electric conductive sections 26 and 28 are filled with an insulating material. With this structure, the insulating layers 32 are formed. Further, the stopper metal layers 34 are respectively formed on the surfaces of the insulating layers 32. After forming the stopper metal layers 34, resin covering the cable patterns 26 and the land pads 28 are removed by abrasion, so that the height of the cable patterns 26 and the land pads 28 are made equal to that of the insulating layers 32.

In FIG. 6B, the stopper metal layers 34 have been removed, by etching. The height of the cable patterns 26 and the land pads 28 are equal to that of the insulating layers 32.

Figure 7A:
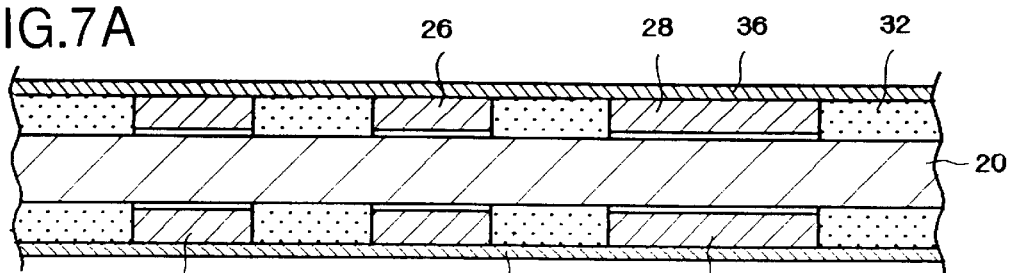
FIGS. 7A–7C are explanation views showing the steps of forming electric conductive sections on the land pads of the both sides of the core board.
Figure 7B:
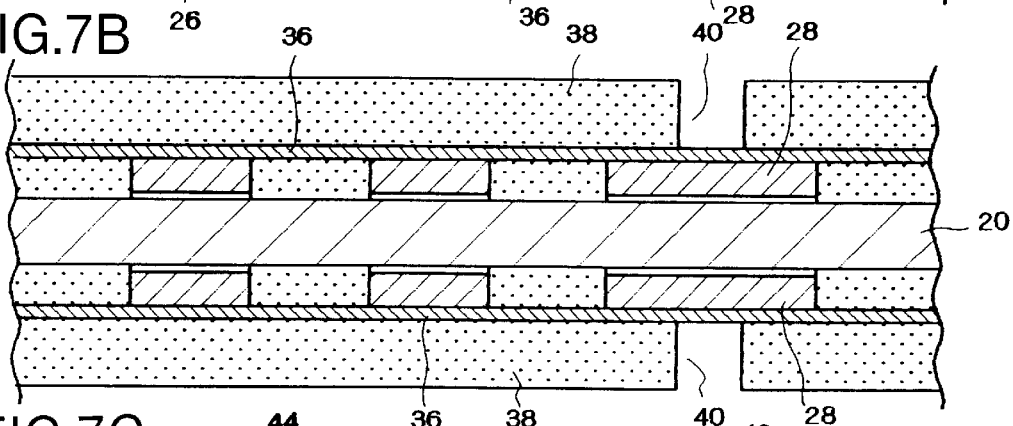
Figure 7C:
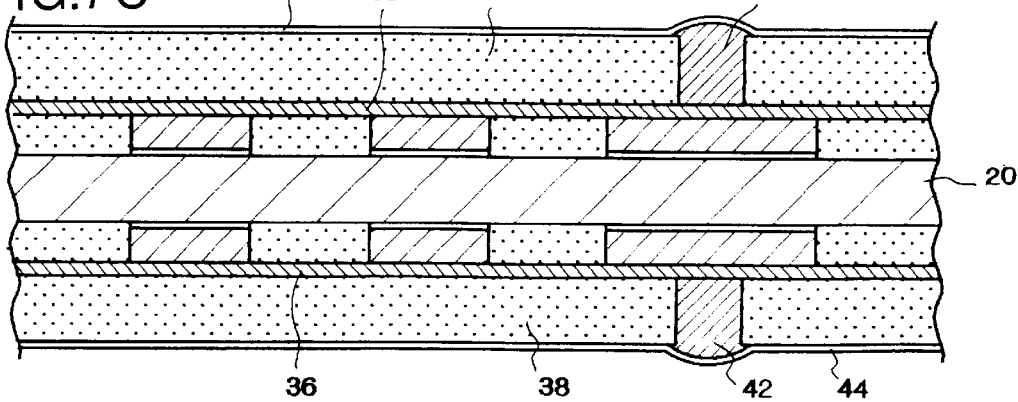

FIGS. 7A–7C show the steps of forming the electric conductive sections on the land pads; and FIGS. 8A–8C show the steps of forming the post vias on the land pads of the both sides of the core board 20.

In FIG. 7A, the electric conductive layers 36 are formed, by nonelectrolytic copper plating, on the cable patterns 26, the land pads 28 and the insulating layers 32.

In FIG. 7B, the resist layers 38 are respectively formed on the surfaces of the electric conductive layers 36, and the via holes 40 are respectively bored in the resist layers 38. Since the resist layers 38 are formed on the flat surfaces as well as the first embodiment, the via holes 40 can be bored precisely.

In FIG. 7C, the via holes 40 are filled with copper by electrolytic plating, in which the electric conductive layers 36 are used as the electric feeder layers, so as to form the electric conductive section 42, which will be the post vias. Further, the stopper metal layers 44 are respectively formed on the both sides. Note that, the height of the resist layers 38 will be standard height for an abrasion step, so the resist layers 38 are made hard after the via holes 40 are bored.

In FIG. 8A, the height of the abraded electric conductive sections 42 are equal to the thickness of the resist layers 38. Even if the height of the electric conductive sections 42 were uneven due to plating properties, the height can be made equal because the upper ends of the electric conductive sections 42 were slightly projected from the via holes 40 and the projected upper ends were abraded. Namely, the height of the electric conductive sections 42, which will be the post vias, can be correctly adjusted.

In FIG. 8B, the flashes 42a of the electric conductive sections 42 have been removed by soft etching.

In FIG. 8C, the stopper metal layers 44 and the resist layers 38 have been removed in this order. Further, the exposed parts of the electric conductive layers 36 have been removed, so that the electric conductive sections 42 are left on the land pads 28 as the post vias.

Figure 9A:
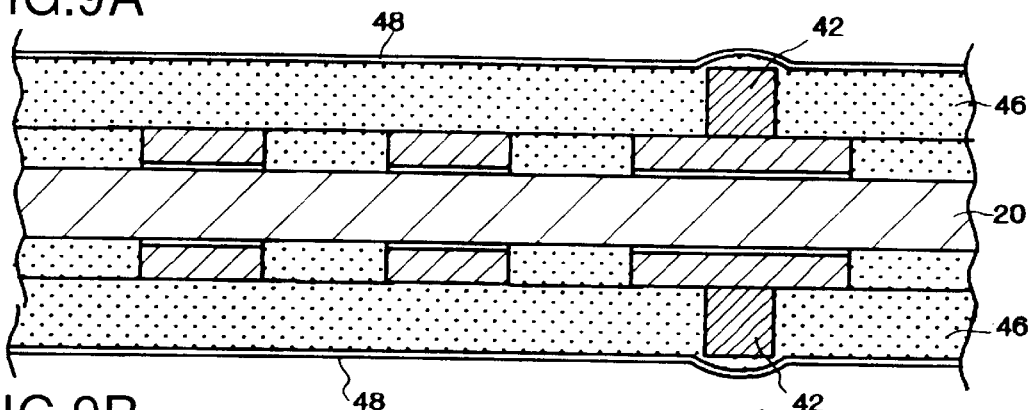
FIGS. 9A–9D are explanation views showing the steps of forming insulating layers enclosing the post via of the both sides of the core board.
Figure 9B:
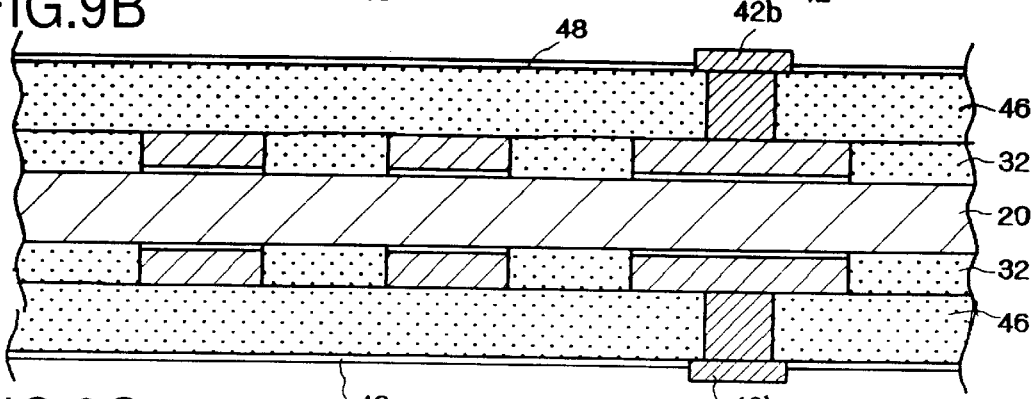
Figure 9C:
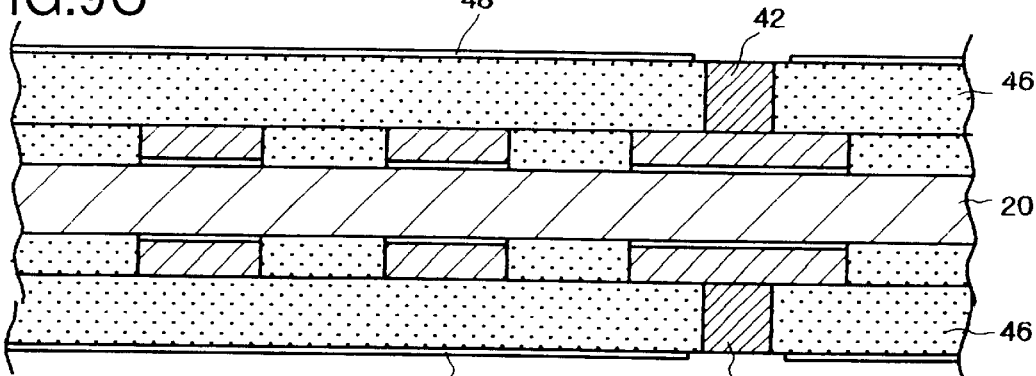

FIGS. 9A–9C show the steps of forming the insulating layers in the layers in which the electric conductive sections 42 are formed.

In FIG. 9A, the insulating layers 46 are formed by laminating the both surfaces of the core board 20, on which the post vias 42 have been formed, then the insulating layers 46 are coated with the stopper metal layers 48.

In FIG. 9B, the resin covering over the electric conductive sections 42 are abraded until the top ends of the electric conductive sections 42 are exposed.

In FIG. 9C, the height of the electric conductive layers 42 are made equal to that of the insulating layers 48 by abrasion. The stopper metal layers 48 are left on the surface of the insulating layers 46. Flashes 42b have been removed from the electric conductive sections 42 by soft etching.

Figure 9D:
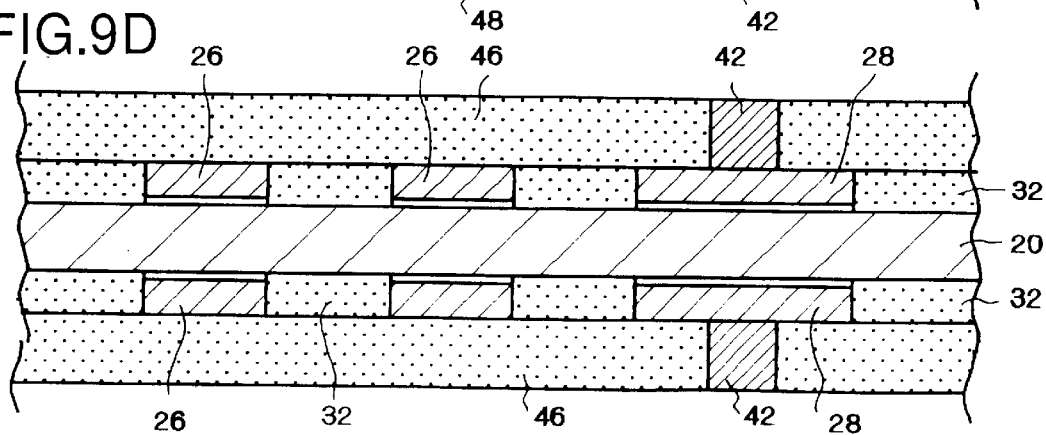

In FIG. 9D, the stopper metal layers 48 have been removed, and the surfaces of the insulating layers 46 and the post vias 42 are made flat. With the above described steps, the first layers, each of which includes the cable patterns 26 and the post via 42, of the multilayer circuit can be formed on the both sides of the core board 20. The cable patterns 26 are electrically insulated by the insulating layers 46 and will be electrically connected to the cable patterns in the second layers by the post vias 42.

By piling a plurality of circuit layers, which are mutually connected by the post vias, on the both sides of the core board 20, the multilayer circuit board of the second embodiment can be manufactured.

Third Embodiment

A third embodiment will be explained with reference to FIG. 10. Note that, elements explained in the foregoing embodiments are assigned the same symbols and explanation will be omitted.

Figure 10:
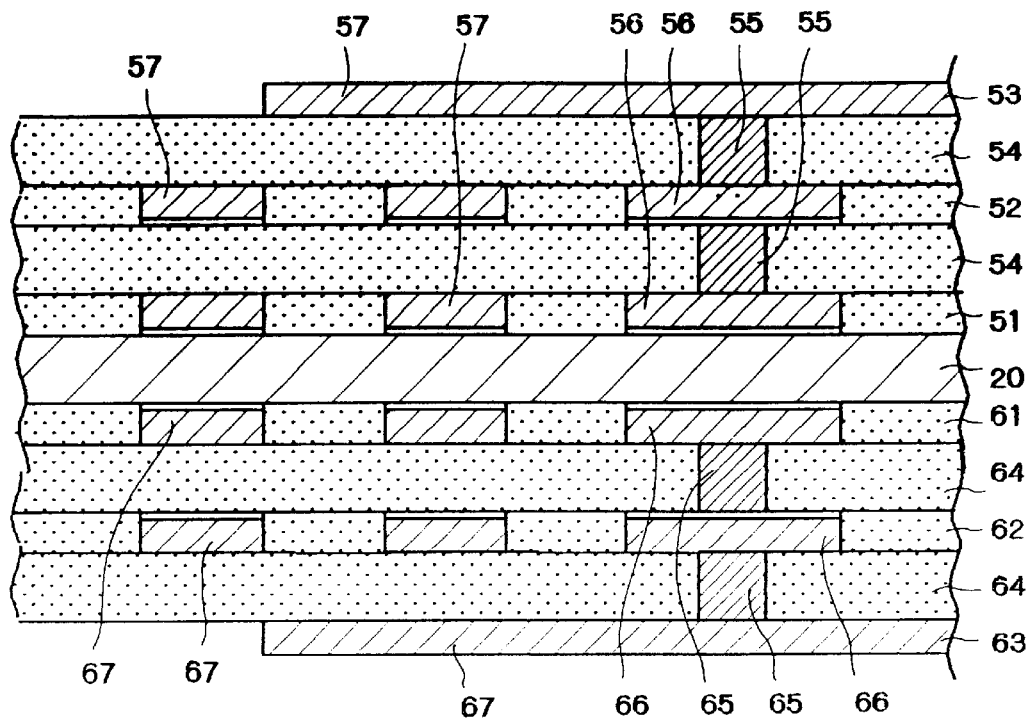
FIG. 10 is a sectional view of the multilayer circuit board of a third embodiment.
Figure 11:
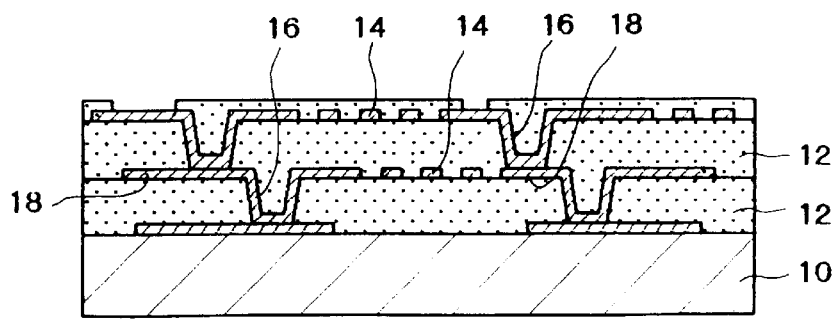
FIG. 11 is a sectional view of the conventional multilayer circuit board.

In FIG. 10, three circuit layers are formed on the both sides of the core board 20. The circuit layers 51—53 are formed on the upper side of the core board 20; the circuit layers 61—63 are formed on the lower side of the core board 20. Symbols 54 and 64 stand for the insulating layers; symbols 55 and 65 stand for the post vias; symbols 56 and 66 stand for the post vias; and symbols 57 and 67 stand for the cable patterns.

In the present embodiment, the cable patterns 57 and 67 in the adjacent circuit layers are electrically connected by the post vias 55 and 65, so the post vias 55 and 65 in the adjacent circuit layers need not be shifted. Therefore, spaces for the land pads 56 and 66 can be smaller, and spaces for the cable patterns 57 and 67 can be broader.

In the present embodiment too, the height of the electric conductive sections are made equal to that of the insulating layer in the cases of forming the cable patterns 57 and 67 and forming the post vias 55 and 65. Therefore, even if many circuit layers are piled on the organic core board, the surfaces of the circuit layers are not waved as well as the multilayer circuits formed on a ceramic core board. Reliability of the multilayer circuit board can be improved.

Since the height of the electric conductive sections for the cable patterns 57 and 57, the post vias 55 and 65, etc. and the height of the insulating layers 54 and 64 are highly precisely controlled, forming the electric conductive sections and the insulating layers, which have uneven height, and forming waved surfaces thereof can be prevented. Therefore, the cable patterns 57 and 67 and the post vias 55 and 65 can be precisely formed into the prescribed patterns by photolithography, etc. The very fine cable patterns can be formed with higher density. In the present embodiment, width of the cable pattern is 15 μm; clearance between the adjacent patterns is 15 μm; and a diameter of the post via is 20 μm.

In the present embodiment, the height of the electric conductive layer are made equal to that of the insulating layer in each layer, but they need not be made equal in the all layers. Namely, it is important to control the height or the thickness of the electric conductive sections, e.g., the cable patterns, the land pads, so as to make the surface of the insulating layers, which cover the electric conductive sections, highly flat. But, in the casa that the height of the post vias can be precisely controlled, the step of abrading the electric conductive sections may be omitted. In the case of forming the insulating layer in the layer in which the post vias are formed, if the thickness of the insulating layer can be made equal to the height of the post vias by laminating with the insulating film, the top end faces of the post vias may be exposed without abrasion. In the case that number of the circuit layers is small and minute wave of the surfaces of the insulating layers are allowed, manufacturing steps may be simplified.

In the present invention, the material of the core board is not limited, so many kinds of materials including an organic material may be employed. The method of manufacturing the multilayer circuit board can be applied to the case of manufacturing large-sized circuit boards, dividable circuit boards, which will be divided into small-sized pieces, etc. Arrangement of the cable patterns and the post vias may be designed according to specifications.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A method of manufacturing a multilayer circuit board, comprising the steps of:
    forming a plurality of cable layers, each of which includes electric conductive sections;
    forming a plurality of first insulating layers, each of which encloses said electric conductive sections in each cable layer; and
    forming post vias, which electrically connect said electric conductive sections in one cable layer to those in another cable layer,
    wherein said electric conductive sections of each cable layer are formed by the steps of:
        forming a first electric conductive layer;
        forming a first resist layer, whose thickness is equal to that of said electric conductive sections to be formed, on a surface of said first electric conductive layer;
        etching said first resist layer so as to expose parts of said first electric conductive layer corresponding to said electric conductive sections to be formed; and
        executing electrolytic plating on the exposed parts of said first electric conductive layer so as to cast up said exposed parts and form said electric conductive sections until height of said electric conductive sections are made higher than that of said first resist layer;
        forming a first stopper metal layer on said first resist layer and said electric conductive sections, which has been casted up the electrolytic plating; and
        abrading said electric conductive sections until the height of said electric conductive sections are made equal to that of said first resist layer.

2. The method according to claim 1,
    wherein said electric conductive sections of each cable layer are further treated by the steps of:
        removing said first stopper metal layer and said first resist layer;
        removing the exposed parts of said first electric conductive layer; and
        forming said first insulating layer so as to enclose said electric conductive sections and fill spaces therebetween.

3. The method according to claim 1,
    wherein said electric conductive sections of eachcable layer are further treated by the steps of:
        removing said first stopper metal layer and said first resist layer;
        removing the exposed parts of said first electric conductive layer;
        forming said first insulating layer so as to cover said electric conductive sections and fill spaces therebetween;
        forming a second stopper metal layer on said first insulating layer; and
        abrading said first insulating layer on said electric conductive sections until the height of said electric conductive sections are made equal to that of said first insulating layer.

4. The method according to claim 1,
    wherein said post vias are formed by the steps of:
        forming a second electric conductive layer on said electric conductive sections and said first insulating layer;
        forming a second resist layer on said second electric conductive layer;
        forming via holes in said second resist layer; and
        executing electrolytic plating in said via holes so as to form said post vias.

5. The method according to claim 4,
    further comprising the steps of:
        forming a third stopper metal layer on said second resist layer and said post vias; and
        abrading said post vias until the height of said post vias are made equal to that of said second resist layer.

6. The method according to claim 4,
    further comprising the steps of:
        removing said second resist layer;
        forming a second insulating layer, which covers and encloses said post vias;
        forming a fourth stopper metal layer on said second insulating layer; and
        abrading parts of said second insulating layer corresponding to said post vias until the height of said post vias are made equal to that of said second insulating layer.

7. The method according to claim 1,
    wherein said cable layers,said insulating layers and said post vias are formed on both sides of a core board.

8. The method according to claim 1,
    wherein said resist layer is treated to improve hardness thereof.

* * * * *